(12) United States Patent
Sakoh

(10) Patent No.: US 6,858,916 B2
(45) Date of Patent: Feb. 22, 2005

(54) SEMICONDUCTOR MEMORY DEVICE WITH SERIES-CONNECTED ANTIFUSE-COMPONENTS

(75) Inventor: Takashi Sakoh, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/411,334

(22) Filed: Apr. 11, 2003

(65) Prior Publication Data
US 2003/0198109 A1 Oct. 23, 2003

(30) Foreign Application Priority Data
Apr. 18, 2002 (JP) ........................................ 2002-116313

(51) Int. Cl.⁷ .............................................. H01L 29/00
(52) U.S. Cl. ...................................... 257/530; 257/552
(58) Field of Search ................................ 257/530, 532, 257/539, 545, 551, 552

(56) References Cited

U.S. PATENT DOCUMENTS 5,412,261 A * 5/1995 Whitten ........................ 264/41
6,584,029 B2 * 6/2003 Tran et al. ................ 365/225.7

FOREIGN PATENT DOCUMENTS

| JP | 8-316324 | 11/1996 |
| JP | 11-191614 | 7/1999 |
| JP | 11-328991 | 11/1999 |
| JP | 2000-123592 | 4/2000 |
| JP | 2001-28397 | 1/2001 |

* cited by examiner

Primary Examiner—Phuc T. Dang
(74) Attorney, Agent, or Firm—Young & Thompson

(57) ABSTRACT

A semiconductor memory device comprises memory cells in rows and columns. Each memory is of the capacitor type and includes one portion of a dielectric layer. Antifuse-components are connected in series one after another between a power source electrode and an output terminal that is grounded when a MOS transistor is conductive.

16 Claims, 5 Drawing Sheets

SEMICONDUCTOR MEMORY DEVICE WITH SERIES-CONNECTED ANTIFUSE-COMPONENTS

BACKGROUND OF THE INVENTION

1. Field of the Invention

The present invention relates generally to semiconductor devices, and more particularly to semiconductor memory devices with antifuses.

2. Description of the Related Art

As the number of electronic elements contained on semiconductor integrated circuits continues to increase, the problem of reducing and eliminating defects in the elements becomes more difficult. To achieve higher population capacities, circuit designs strive to reduce the size of the individual elements to maximize available die real estate. The reduced size, however, makes these elements increasingly more susceptible to defects. These defects can be identified upon completion of the integrated circuits by testing procedures at the semiconductor chip level. Scraping or discarding defective circuits is economically undesirable, particularly if only a small number of elements are actually defective.

To reduce the amount of semiconductor scrap, therefore, redundant elements are provided on the circuit. If a primary element is determined to be defective, a redundant element can be substituted for the defective element. Substantial reductions in scrap can be achieved by using redundant elements.

One type of integrated circuit device that uses redundant elements is semiconductor memory, such as a dynamic random access memory (DRAM). 64 Mbit, 128 Mbit, 256 Mbit and 512 Mbit DRAMs are available in the market. Typical DRAM circuits comprise millions of equivalent memory cells arranged in addressable rows and columns. With redundant elements, either as rows or columns, defective primary rows and columns can be replaced. Thus, using redundant elements reduces scrap without substantially increasing the cost of the memory circuit.

Because the individual primary elements of a memory are separately addressable, replacing a defective element typically comprises selecting a bank of switch circuits, each switch circuit typically being an antifuse circuit, respectively, to 'program' a redundant element to respond to the address of the defective element, and then enabling the redundant element by programming to enable antifuse circuit.

U.S. Pat. No. 6,249,472 B1 issued Jan. 19, 2001 to Tamura et al., which corresponds to JP H11-191614 A, shows a semiconductor memory device whose antifuse can be formed without any additional film forming process.

With reference to FIGS. 6–8, the known technique according to U.S. Pat. No. 6,249,472 B1 of forming antifuses without any additional film forming process is implemented. FIG. 6 is a cross sectional view of a portion of a semiconductor memory device, showing a MOS transistor 10 coupled to an antifuse 20. The MOS transistor 10 includes a gate 1, a source 2 and a drain 3. FIG. 7 is a cross sectional view of another portion of the semiconductor memory device, showing a memory cell 50 including a capacitor 40 and a MOS transistor 30. The MOS transistor 30 includes a gate 11, a source 12 and a drain 13.

The sources 2 and 12 are diffused regions, which are formed in a semiconductor substrate concurrently. Similarly, the drains 3 and 13 are diffused regions, which are formed in the semiconductor substrate concurrently. The gates 1 and 11 are formed on the semiconductor substrate, concurrently.

As shown in FIG. 7, the capacitor 40 of the memory cell 50 includes one portion 14 of a dielectric layer. As shown in FIG. 6, the antifuse 20 includes another or second portion 105 of the same dielectric layer. This dielectric layer is formed in the conventional deposition process, and etched to provide the dielectric layer portions 15 and 105 concurrently.

In FIG. 7, the capacitor 40 includes a capacitor first electrode 14 that is a first portion of a first conductive layer. The first conductive layer is formed on one side surface of the dielectric layer. The capacitor 40 also includes a capacitor second electrode 16 that is a first portion of a second conductive layer. The second conductive layer is formed on the opposite side surface of the dielectric layer. The capacitor electrodes 14 and 16, which may be called as capacitor lower and upper electrodes, respectively, have interposed therebetween the capacitor dielectric layer portion 15.

In FIG. 6, the antifuse 20 includes an antifuse first electrode 104 that is a second portion of the above-mentioned first conductive layer. The antifuse 20 also includes an antifuse second electrode 106 that is a second portion of the above-mentioned second conductive layer. The electrodes 104 and 106, which may be called as antifuse lower and upper electrodes, respectively, have interposed therebetween the antifuse dielectric layer portion 105.

The above-mentioned first conductive layer is formed in the conventional CMOS process, and etched to provide the capacitor and antifuse electrodes 14 and 104 concurrently. Similarly, the above-mentioned second conductive layer is formed in the conventional CMOS process, and etched to provide the capacitor and antifuse electrodes 16 and 106 concurrently.

In FIG. 7, the capacitor lower electrode 14 is electrically connected via a conductor plug to the drain 13 of the MOS transistor 30. The source 12 of the MOS transistor 30 is electrically connected via a conductor plug to a digit line 17.

In FIG. 6, the antifuse lower electrode 104 is electrically connected via a conductor plug to the drain 3 of the MOS transistor 10. The source 2 of the MOS transistor 10 is electrically connected via a conductor plug to a ground level potential electrode 7, which is held at ground potential VGND. The antifuse upper electrode 106 is electrically connected via a conductor plug to an upper potential level electrode 8, which may be connected to a power source having power source voltage VDD or an antifuse enabling power source having breakdown voltage. The breakdown voltage is higher than the power source voltage VDD.

FIG. 8 is an antifuse circuit corresponding to FIG. 6. In the illustrated antifuse circuit, the power source voltage VDD is applied to the electrode 8 with the electrode 7 grounded so that the difference in potential across the electrodes 8 and 7 may be expressed as VDD−VGND.

If the dielectric layer portion 105 of the antifuse 20 is not punctured yet, the output VOUT at an output terminal 60 is equal to the ground potential VGND when the MOS transistor 10 is conductive. The ground potential VGND may be considered as high as 0 volt (VGND=0 volt). Thus, the output VOUT at the output terminal 60 is 0 volt. Under this condition, the power source voltage VDD may be applied to the dielectric layer portion 105 of the antifuse 20.

The dielectric layer portion 105 of the antifuse 20 is punctured when, with the MOS transistor 10 conductive, the breakdown voltage is applied. After the dielectric layer portion 105 has been punctured to short the antifuse lower and upper electrodes 104 and 106 of the antifuse 20, the output at the output terminal 60 is equal to the power source voltage VDD when the MOS transistor 10 is conductive.

As mentioned before, applying the breakdown voltage to the antifuse shorts an antifuse associated with a redundant circuit that is to substitute a defective circuit. Thus, the occurrence of such substitution of the defective circuit can be determined by examining the level of the output VOUT at the output terminal 60.

To maximize available die real estate, circuit designs strive to reduce the size of the individual memory cells. Taking the semiconductor memory device in FIGS. 6 and 7 as an example, reduction in size of each capacitor 40 without any reduction in its capacity is required. The reduced size inevitably results in reduced area of the capacitor dielectric layer portion 15, causing the capacity to reduce. The capacity is proportional to the area, but it is inversely proportional to the thickness. Thinning the capacitor dielectric layer portion 15 is important in suppressing the reduction in capacity accompanying the size reduction of the individual memory cells.

As the thickness reduces, the breakdown voltage of the capacitor dielectric layer portion 15 drops. Applying the power source voltage VDD as it is to the individual memory cells limits thinning the dielectric layer portion 15. Recently, it is the prevailing practice to apply one half (½) of VDD to the individual memory cells. This practice makes great contribution to maintaining the required capacity needed for the size reduction of the memory cells.

As mentioned before, the dielectric layer portion 105 of the antifuse 20 and the dielectric layer portion 15 of the memory cell 50 are formed out of the same dielectric layer. Thus, the dielectric layer portions 105 and 15 are of the same thickness.

If, here, the antifuse circuit in FIG. 8 is used, the dielectric layer portion 105 may be subjected to power source voltage VDD during normal operation of the memory device. As it is formed concurrently with the capacitor 40 of the memory device (DRAM) in the same fabrication processes, the antifuse 20 has potential problem that its component might be deteriorated by application of power source voltage VDD and in the fatal case the dielectric layer portion 105 might be punctured.

Thus, a need remains for a semiconductor memory device with a reliable antifuse.

The following three sections provide description on the prior art, which involves JP P2000-123592 A (=U.S. Pat. No. 6,115,283 issued Sep. 5, 2000 to Hidaka, U.S. Pat. No. 6,469,923 B1 issued Oct. 22, 2002 to Hidaka), JP P2001-28397 A and JP H08-316324 A.

JP P2000-123592 A discloses a semiconductor memory device with capacitor-type antifuses arranged in rows and columns within a peripheral region. The capacitor-type antifuses are connected in parallel. They are of the same configuration as capacitors of memory cells and fabricated within the peripheral region using the same pattern as used in fabricating the memory cells.

JP P2001-28397 A discloses a semiconductor device in the form of a field programmable gate array (FPGA). The FPGA includes a lower wiring layer formed on a semiconductor substrate, an antifuse layer on the lower electrode, an etch stop layer on the antifuse layer, and an interlayer dielectric layer. A conductor plug fills a via-hole formed through the interlayer dielectric layer. At one end, the conductor plug is connected to the etch stop layer. At the opposite end, the conductor plug is connected to an upper wiring formed on the interlayer dielectric layer.

JP H08-316324 discloses a method of fabricating a semiconductor device. According to this method, an antifuse is formed together with a metal-insulator-semiconductor field effect transistor (MISFET) sharing a hole forming process and an electrode forming process. A connection hole between lower and upper electrodes of an antifuse and a connection hole for wiring a MISFET are formed in the same process. The lower electrode and a source/drain of the MISFET are formed in the same process.

SUMMARY OF THE INVENTION

An object of the present invention is to provide a semiconductor memory device with a reliable antifuse.

According to one exemplary implementation of the present invention, a semiconductor memory device comprises:

a memory cell including one portion of a dielectric layer; and a plurality of antifuse-components including another portion of the dielectric layer, the plurality of antifuse-components being connected in series one after another.

BRIEF DESCRIPTION OF THE DRAWINGS

The present invention will be apparent from the following more particular description of exemplary embodiments of the invention as illustrated in the accompanying drawings. The drawings are not necessarily scale, emphasis instead being placed upon illustrating the principles of the invention.

DESCRIPTION OF THE EXEMPLARY EMBODIMENTS

Figure 1:
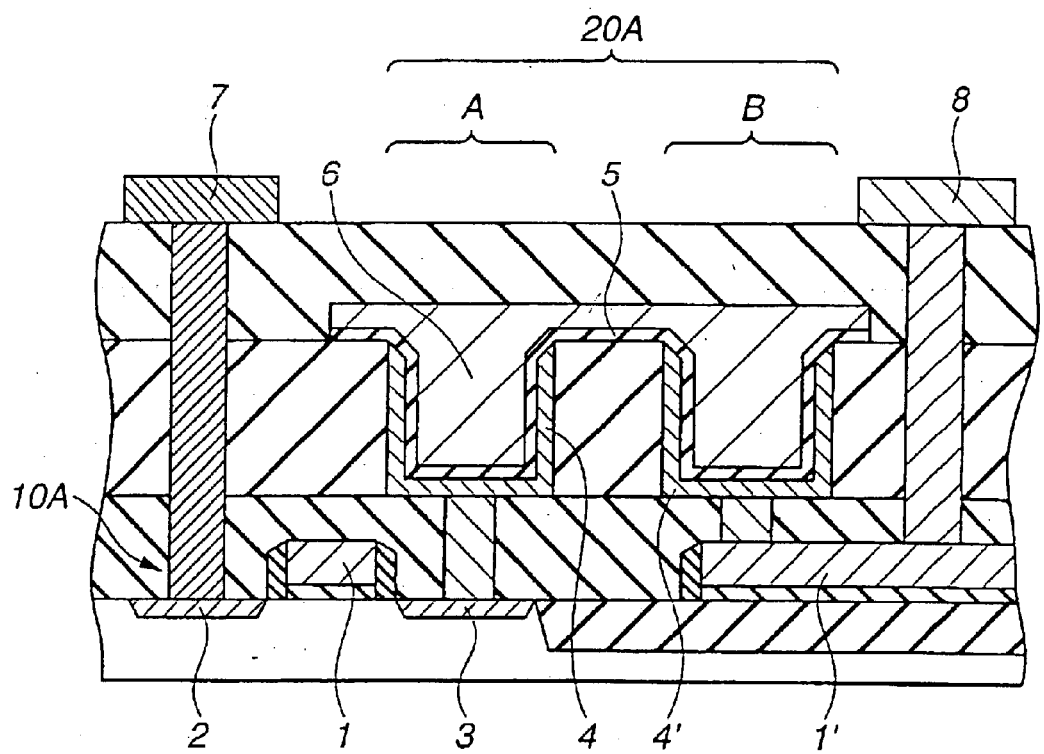
FIG. 1 is a cross sectional view of a portion of a semiconductor memory device whose another portion is shown in FIG. 7, illustrating one embodiment according to the present invention.

Referring to the accompanying drawings, like reference numerals are used to designate like parts or portions throughout each view of FIGS. 1 to 5 for the sake of brevity of description.

Figure 7:
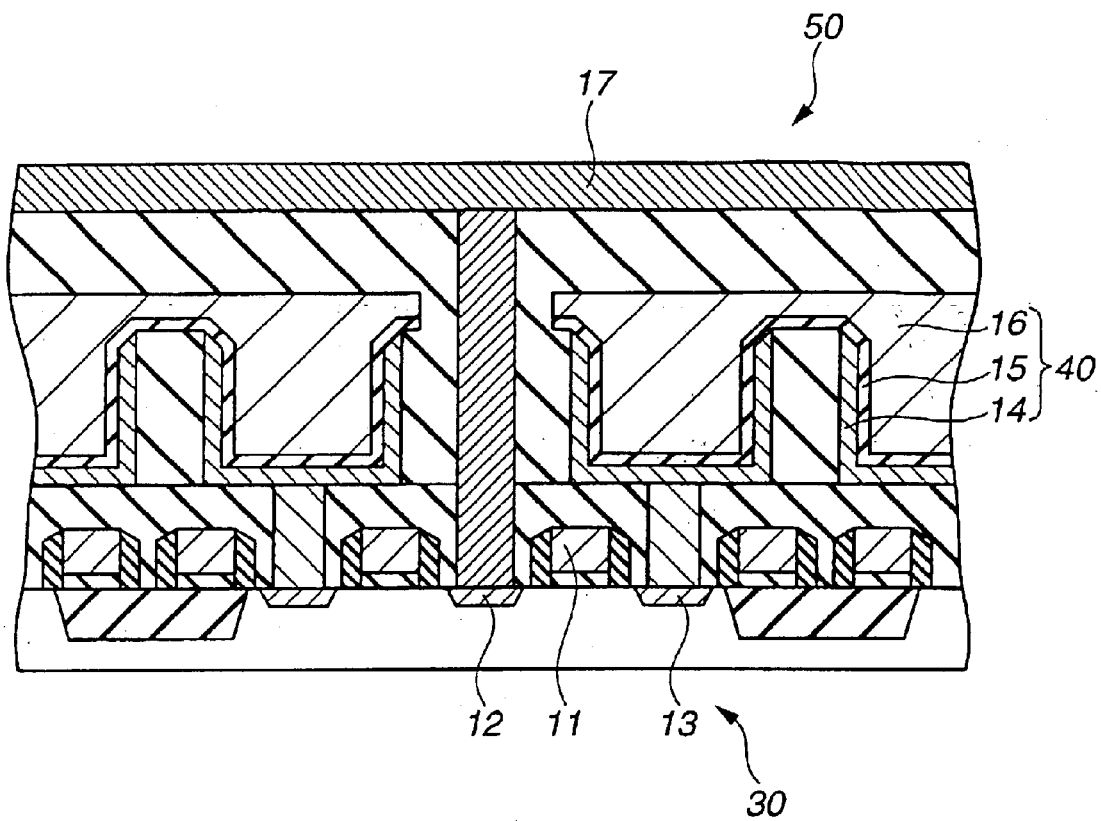
FIG. 7 is a cross sectional view of another portion of the semiconductor memory device, showing a memory cell including a capacitor and a MOS transistor.
Figure 8:
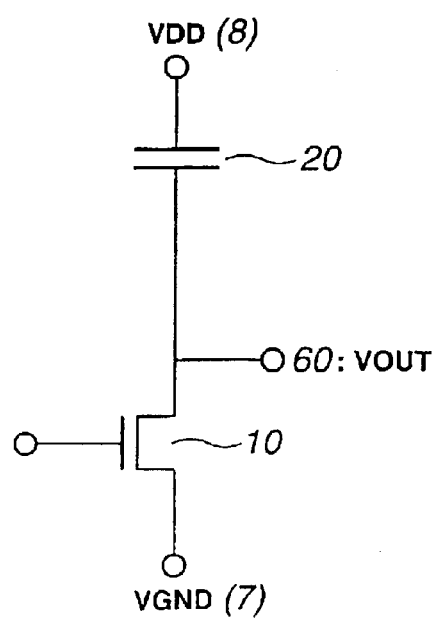
FIG. 8 is an antifuse circuit corresponding to FIG. 6.

FIGS. 1 and 7 illustrate one embodiment of a semiconductor memory device according to the present invention. As shown in FIG. 7, the semiconductor memory device comprises a memory cell 50 including one portion 15 of a dielectric layer. As shown in FIG. 1, the semiconductor memory device comprises a plurality, two in this embodiment, of antifuse-components, generally indicated by the reference characters A and B, respectively. The antifuse-components A and B are electrically connected in series one after another to form an antifuse, generally indicated at 20A. The antifuse-components A and B include another portion 5 of the above-mentioned dielectric layer. The one and another portions 15 and 5 are formed out of the same dielectric layer concurrently in the same etch process after depositing the dielectric layer.

With continuing reference to FIG. 1, a semiconductor substrate includes a MOS transistor 10A. The MOS transistor 10A includes a gate 1, a source 2 and a drain 3. The source 2 and drain 3 are diffused regions formed in a semiconductor substrate. The source 2 is electrically connected to a ground level potential electrode 7, which is held at ground potential VGND. The drain 3 is electrically connected to the antifuse-component A.

With continuing reference to FIG. 7, the semiconductor substrate also includes a MOS transistor 30 electrically coupled to a capacitor 40 of the memory cell 50. The MOS transistor 30 includes a gate 11, a source 12 and a drain 13. The source 12 is electrically connected to a ground level potential electrode 17. The drain 13 is electrically connected to the capacitor 40. The capacitor 40 includes a capacitor first or upper electrode 16. The capacitor upper electrode 16 is a first portion of a first or upper conductive layer. The first or upper conductive layer is formed, by deposition for example, on the upper side surface of the dielectric layer during fabrication of the semiconductor memory device. The capacitor 40 also includes a capacitor second or lower electrode 14. The capacitor lower electrode 14 is a first portion of a second or lower conductive layer. The second or lower conductive layer is formed, by deposition for example, over the semiconductor substrate during fabrication of the semiconductor memory device. The capacitor lower and upper electrodes 14 and 16 have interposed between them the one portion of capacitor dielectric layer portion 15.

With reference again to FIG. 1, the antifuse 20A includes two antifuse-components, namely first and second antifuse-components A and B. The first antifuse-component A includes an antifuse first or upper electrode 6. The antifuse upper electrode 6 is a second portion of the upper conductive layer. The first antifuse-component A further includes an antifuse second or lower electrode 4. The antifuse lower electrode 4 is a second portion of the lower conductive layer. The second antifuse-component B includes the antifuse first or upper electrode 6. The second antifuse-component B further includes an antifuse third or lower electrode 4'. The third or lower electrode 4' is a third portion of the lower conductive layer. The antifuse upper and lower electrodes 6 and 4 of the first antifuse-component A have interposed between them one section of another antifuse dielectric layer portion 5. The antifuse upper and lower electrodes 6 and 4' of the second antifuse-component B have interposed between them another section of the antifuse dielectric layer portion 5. The antifuse dielectric layer portion 5 has the other section between the one and another section. This section of the antifuse dielectric layer portion 5 provides electrical separation and insulation between the antifuse lower electrodes 4 and 4'.

Figure 2:
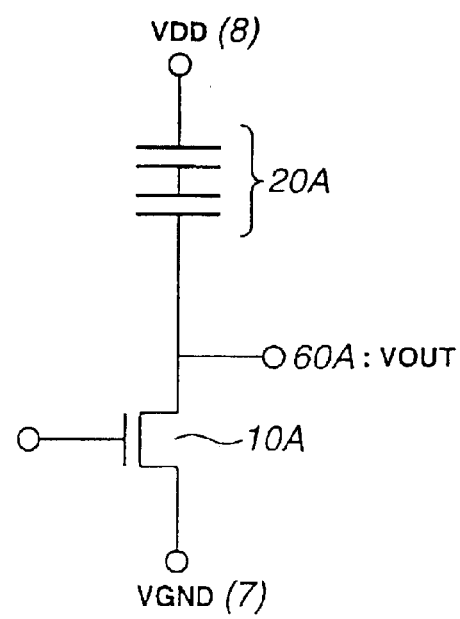
FIG. 2 is an antifuse circuit corresponding to FIG. 1.

With reference also to the antifuse circuit in FIG. 2, one of the antifuse lower electrodes 4 and 4' of the antifuse 20A is coupled to an output terminal 60A and also to the MOS transistor 10A. The other of the antifuse lower electrodes 4 and 4' is coupled to a power source electrode 8 that is normally connected to a power source. The power source has a power source voltage VDD. The power source voltage VDD is greater than an operation voltage that is used to charge the capacitor 40 of the memory cell 50. In the embodiment, the operation voltage is half (½) the power source voltage VDD.

According to the illustrated embodiment in FIG. 1, the antifuse lower electrode 4 of the first antifuse-component A is electrically connected to the drain 3 of the MOS transistor 10A via a conductor plug. The antifuse lower electrode 4' of the second antifuse-component B is electrically connected to the power source electrode 8 via a conductor layer portion 1' and a conductor plug. The conductor layer portion 1' has substantially the same configuration as the gate 1 because it is formed during processes of forming the gate 1 of the MOS transistor 10A. The conductor layer portion 1' is just one example of establishing electrical connection between the antifuse lower electrode 4' of the second antifuse-component B and the power source electrode 8. Another example is used in another embodiment shown in FIG. 5.

Figure 5:
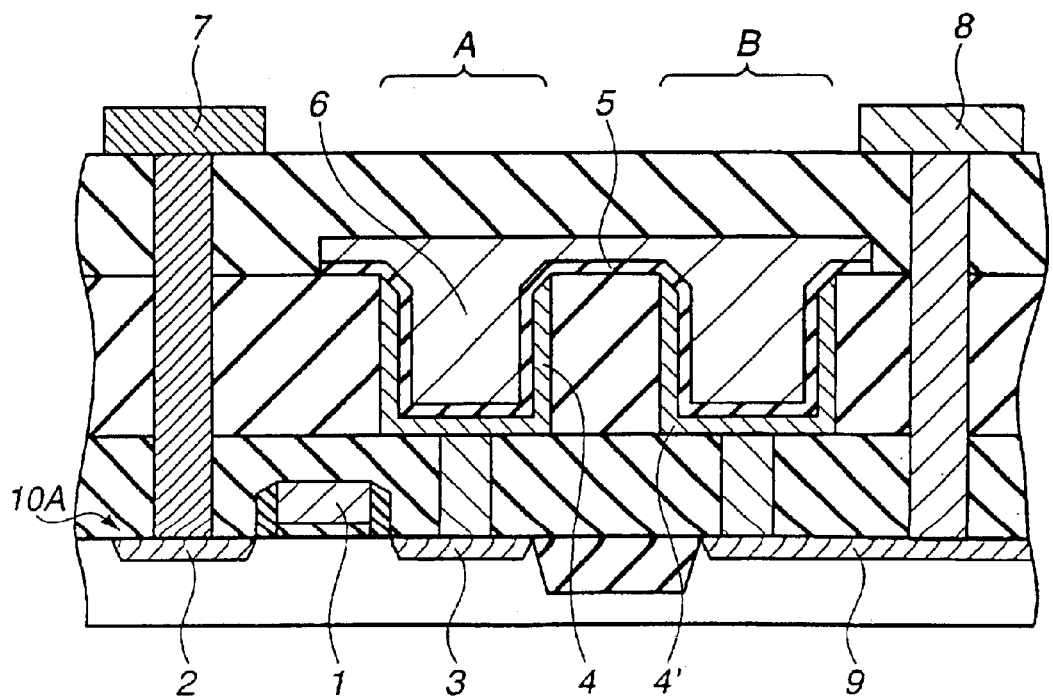
FIG. 5 is a cross sectional view of a portion of a semiconductor memory device whose another portion is shown in FIG. 7, illustrating another embodiment according to the present invention.
Figure 6:
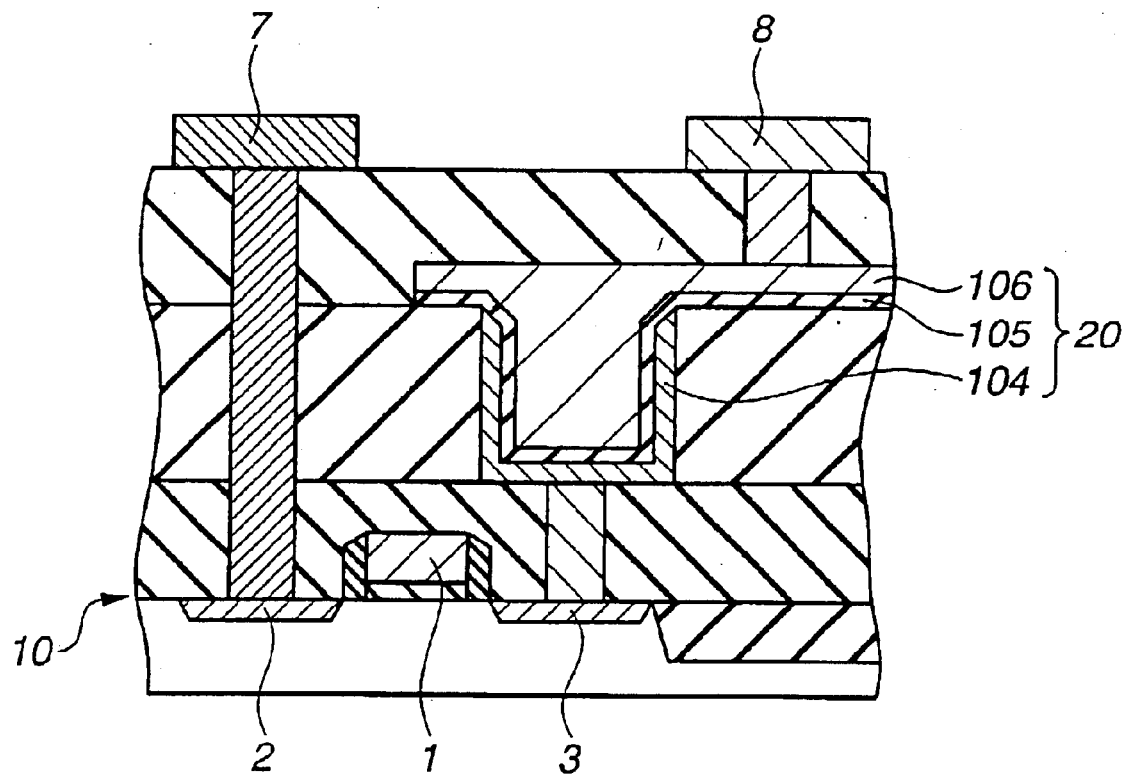
FIG. 6 is a cross sectional view of a portion of a semiconductor memory device discussed before, showing a MOS transistor coupled to an antifuse.

Referring to the embodiment in FIG. 5, a diffused region 9 formed in a semiconductor substrate establishes electrical connection between an antifuse lower electrode 4' of a second antifuse-component B and a power source electrode 8. The diffused region 9 is formed concurrently with diffused regions for the source and drain of the MOS transistors 10A and 30 (see FIG. 7). The embodiment in FIG. 5 is substantially the same as the embodiment in FIG. 1 except the above-mentioned electrical connection.

As discussed before, the dielectric layer yields the capacitor dielectric layer portion 15 and antifuse dielectric layer portion 5. The dielectric layer has a breakdown voltage. The breakdown voltage becomes low as the capacitor dielectric layer portion 15 and antifuse dielectric layer portion 5 becomes thin.

In the illustrated antifuse circuit of FIG. 2, it is now assumed that the antifuse dielectric layer portion 5 of the series connected first and second antifuse-components A and B of the antifuse 20A is not punctured yet. In this normal state, the power source voltage VDD is applied to the electrode 8 with the electrode 7 grounded so that the difference in potential across the electrodes 8 and 7 may be expressed as VDD−VGND. As the first and second antifuse-components A and B are not punctured, the output VOUT at the output terminal 60A is equal to the ground potential VGND when the MOS transistor 10A is conductive. The ground potential VGND may be considered as high as 0 volt (VGND=0 volt) so that the output VOUT at the output terminal 60A is 0 volt. Under this condition, the power source voltage VDD is applied to the antifuse 20A. The first and second antifuse-components A and B are connected in series between the power source electrode 8 and the output terminal 60A. The halves (½) of the power source voltage VDD are applied to the first and second antifuse-components A and B, respectively. Specifically, the halves of the power source voltage VDD are applied to the different sections of the antifuse dielectric layer portion 5, respectively.

In the previously described embodiment, the half of the power source voltage VDD is applied to the capacitor upper electrode 16 of the memory cell 50 (see FIG. 7). This allows the capacitor dielectric layer portion 15 to have a much-reduced thickness. The dielectric layer portion 15 may be thinned to such extent that it may deteriorate with application of the power source voltage VDD, but it will not deteriorate with application of the half the power source voltage VDD. As the antifuse 20A and the memory cell 50 are fabricated in the same processes, the antifuse dielectric layer portion 5 and the capacitor dielectric layer portion 15 have the same reduced thickness. The series connection of the first and second antifuse-components A and B allows application of the power source voltage VDD without causing any deterioration of the antifuse dielectric layer portion 5 because the halves of the power source voltage VDD are applied to the different sections of the antifuse dielectric portion 5, respectively.

The previously description on the embodiments illustrated in FIGS. 1, 2 and 5 clearly supports the following features.

In the embodiments, the antifuse 20A is fabricated concurrently with the capacitor 40 of the memory cell 50 in the same processes. The antifuse 20A includes the first and second antifuse-components A and B connected in series between the power source electrode 8 and the drain 3 of the MOS transistor 10A. The output terminal 60A is connected to the drain 3.

In the embodiments, the half of the power source voltage VDD is applied to the capacitor 40 of the memory cell 50. With regard to the antifuse 20A, the halves of the power source voltage VDD are applied to the first and second antifuse-components A and B, respectively.

According to the embodiments, a semiconductor memory device comprises a memory cell 50 including a capacitor 40, an antifuse 20A including first and second antifuse-components A and B connected in series one after another, and a MOS transistor 10A connected in series to the antifuse 20A.

The capacitor 40 of the memory cell 50 includes a capacitor lower electrode 14 formed on a semiconductor substrate, a capacitor dielectric layer portion 15 formed on a surface of the capacitor lower electrode 14, and a capacitor upper electrode 16 formed on a surface of the capacitor dielectric layer portion 15.

The first antifuse-component A includes an antifuse lower electrode 4 formed concurrently with the capacitor lower electrode 14, one section of an antifuse dielectric layer portion 5 formed on a surface of the antifuse lower electrode 4 concurrently with the capacitor dielectric layer portion 15, and an antifuse upper electrode 6 formed on a surface of the one section of the antifuse dielectric layer portion 5 concurrently with the capacitor upper electrode 16.

The second antifuse-component B includes an antifuse lower electrode 4', which is electrically separated from the above-mentioned antifuse lower electrode 4. The antifuse lower electrode 4' is formed concurrently with the capacitor lower electrode 14. The second antifuse-component B also includes another section of the antifuse dielectric layer portion 5 formed on a surface of the antifuse lower electrode 4' concurrently with the capacitor dielectric layer portion 15. The second antifuse-component B further includes the antifuse upper electrode 6 formed on a surface of another section of the antifuse dielectric layer portion 5.

In the antifuse circuit of FIG. 2, the MOS transistor 10A is coupled in series to the antifuse 20A. With the MOS transistor 10A conductive, applying a breakdown voltage to the antifuse 20A punctures the one and another sections of the antifuse, dielectric layer portion 5 to short the antifuse lower electrodes 4 and 4' with each other via the antifuse upper electrode 6. The breakdown voltage is higher than a first or operation voltage (VDD/2) that is applied to the capacitor 40 of the memory cell 50.

It is now assumed that the one and another sections of the antifuse dielectric layer portion 5 are not punctured. In this case, with the MOS transistor 10A conductive, applying a second voltage (VDD), which is higher than the first voltage (VDD/2) but lower than the breakdown voltage, to the antifuse 20A results in applying a voltage generally as high as the first voltage (VDD/2) to each of the first and second antifuse-components A and B.

The other section of the antifuse dielectric layer portion 5 provides electrical insulation between the antifuse lower electrodes 4 and 4'.

The antifuse lower electrode 4' of the second antifuse-component B is electrically connected to a high rank of power source electrode 8 via a conductor layer portion 1' and a conductor plug (see FIG. 1). The conductor layer portion 1' has substantially the same configuration as the gate 1 because it is formed during processes of forming the gate 1 of the MOS transistor 10A.

The conductor layer portion 1' is just one example of establishing electrical connection between the antifuse lower electrode 4' of the second antifuse-component B and the high rank electrode 8. Another example is the use of a diffused region 9 formed in a semiconductor substrate concurrently with diffused regions for the source and drain 2 and 3 of the MOS transistor 10A (see FIG. 5).

From the description on the embodiments shown in FIGS. 1 and 5, it will be appreciated that, in normal operation, applied voltage is divided and the divided portions of the applied voltage are applied to the plurality of antifuse-components A and B. The antifuse-components A and B are connected in series between the power source electrode 8 and the output terminal 60A that is grounded when the MOS transistor 10A is conductive. Eliminating the possibility that the antifuse dielectric layer portion 5 of the antifuse-components A and B may be punctured has enhanced reliability in normal operation of the semiconductor memory device.

Figure 3:
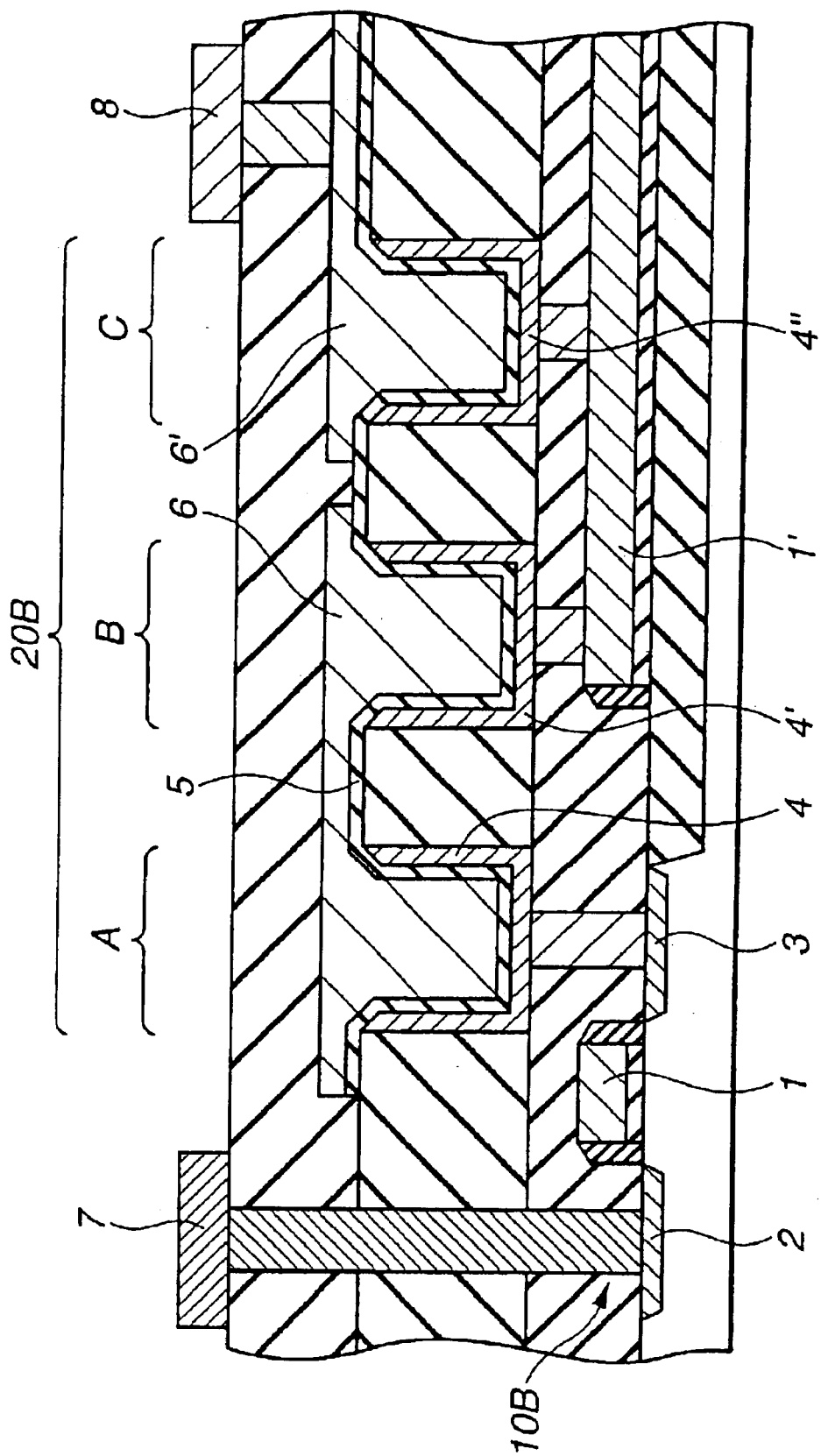
FIG. 3 is a cross sectional view of a portion of a semiconductor memory device whose another portion is shown in FIG. 7, illustrating another embodiment according to the present invention.

FIGS. 3 and 7 illustrate another embodiment of a semiconductor memory device according to the present invention. In the previously described embodiments, the number of antifuse-components connected in series is two (2). In the embodiment of FIG. 3, the number of antifuse-components connected in series is three (3).

As shown in FIG. 7, the semiconductor memory device comprises a memory cell 50 including one portion 15 of a dielectric layer. As shown in FIG. 3, the semiconductor memory device comprises a plurality, three in this embodiment, of antifuse-components, generally indicated by the reference characters A, B and C, respectively. The antifuse-components A, B and C are electrically connected in series one after another to form an antifuse, generally indicated at 20B. The antifuse-components A, B and C include another portion 5 of the above-mentioned dielectric layer. The one and another portions 15 and 5 are formed out of the same dielectric layer concurrently in the same etch process after depositing the dielectric layer.

With continuing reference to FIG. 3, a semiconductor substrate includes a MOS transistor 10B. The MOS transistor 10B includes a gate 1, a source 2 and a drain 3. The source 2 and drain 3 are diffused regions formed in a semiconductor substrate. The source 2 is electrically connected to a ground level potential electrode 7, which is held at ground potential VGND. The drain 3 is electrically connected to the antifuse-component A.

With continuing reference to FIG. 7, the semiconductor substrate also includes a MOS transistor 30 electrically coupled to a capacitor 40 of the memory cell 50. The MOS transistor 30 includes a gate 11, a source 12 and a drain 13. The source 12 is electrically connected to a ground level potential electrode 17. The drain 13 is electrically connected to the capacitor 40. The capacitor 40 includes a capacitor first or upper electrode 16. The capacitor upper electrode 16 is a first portion of a first or upper conductive layer. The first or upper conductive layer is formed, by deposition for example, on the upper side surface of the dielectric layer during fabrication of the semiconductor memory device. The capacitor 40 also includes a capacitor second or lower electrode 14. The capacitor lower electrode 14 is a first portion of a second or lower conductive layer. The second or lower conductive layer is formed, by deposition for example, over the semiconductor substrate during fabrication of the semiconductor memory device. The capacitor lower and upper electrodes 14 and 16 have interposed between them the one portion of capacitor dielectric layer portion 15.

With reference again to FIG. 3, the antifuse 20B includes three antifuse-components, namely first, second and third antifuse-components A, B and C. The first antifuse-component A includes an antifuse first or upper electrode 6. The antifuse upper electrode 6 is a second portion of the upper conductive layer. The first antifuse-component A further includes an antifuse second or lower electrode 4. The antifuse lower electrode 4 is a second portion of the lower conductive layer. The second antifuse-component B includes the antifuse first or upper electrode 6. The second antifuse-component B further includes an antifuse third or lower electrode 4'. The third or lower electrode 4' is a third portion of the lower conductive layer. The third antifuse-component C includes an antifuse fourth or upper electrode 6'. This antifuse upper electrode 6' is a third portion of the upper conductive layer. The third antifuse-component C further includes an antifuse fifth or lower electrode 4". The fifth or lower electrode 4" is a fourth portion of the lower conductive layer. The antifuse upper electrodes 6 and 6' are electrically separated from each other. The antifuse upper and lower electrodes 6 and 4 of the first antifuse-component A have interposed between them first section of another antifuse dielectric layer portion 5. The antifuse upper and lower electrodes 6 and 4' of the second antifuse-component B have interposed between them second section of the antifuse dielectric layer portion 5. The antifuse upper and lower electrodes 6' and 4" of the antifuse-component C have interposed between them third section of the antifuse dielectric layer portion 5. The antifuse dielectric layer portion 5 has another section, which provides electrical separation and insulation between the antifuse lower electrodes 4 and 4'. The antifuse dielectric layer portion 5 has other section, which provides electrical separation and insulation between the antifuse lower electrodes 4' and 4".

Figure 4:
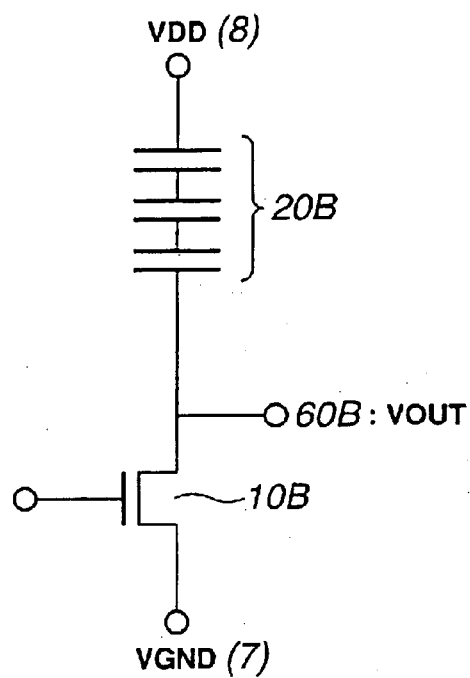
FIG. 4 is an antifuse circuit corresponding to FIG. 3.

With reference also to the antifuse circuit in FIG. 4, the antifuse lower electrode 4 of the first antifuse-component A is coupled to an output terminal 60B and also to the MOS transistor 10B. The antifuse lower electrodes 4' and 4" of the second and third antifuse-components B and C are electrically connected to each other. The antifuse upper electrode 6' of the third antifuse-component C is coupled to a power source electrode 8 that is normally connected to a power source. The power source has a power source voltage VDD. The power source voltage VDD is greater than an operation voltage that is used to charge the capacitor 40 of the memory cell 50. In the embodiment, the operation voltage is half (½) the power source voltage VDD.

According to the illustrated embodiment in FIG. 3, the antifuse lower electrode 4 of the first antifuse-component A is electrically connected to the drain 3 of the MOS transistor 10B via a conductor plug. The antifuse lower electrode 4' of the second antifuse-component B is electrically connected to the antifuse lower electrode 4" of the third antifuse-component C via a conductor layer portion 1' and conductor plugs. The conductor layer portion 1' has substantially the same configuration as the gate 1 because it is formed during processes of forming the gate 1 of the MOS transistor 10B. The conductor layer portion 1' is just one example of establishing electrical connection between the antifuse lower electrode 4' of the second antifuse-component B and the antifuse lower electrode 4" of the third antifuse-component C. Another example is clearly indicated in the embodiment shown in FIG. 5.

That is, a diffused region 9 formed in a semiconductor substrate is used to establishes electrical connection between an antifuse lower electrode 4' of a second antifuse-component B and an antifuse lower electrode 4" of a third antifuse-component C.

In the illustrated antifuse circuit of FIG. 4, it is now assumed that the antifuse dielectric layer portion 5 of the series connected first, second and third antifuse-components A, B and C of the antifuse 20B is not punctured yet. In this normal state, the power source voltage VDD is applied to the electrode 8 with the electrode 7 grounded so that the difference in potential across the electrodes 8 and 7 may be expressed as VDD−VGND. As the first, second and third antifuse-components A, B and C are not punctured, the output VOUT at the output terminal 60B is equal to the ground potential VGND when the MOS transistor 10B is conductive. The ground potential VGND may be considered as high as 0 volt (VGND=0 volt) so that the output VOUT at the output terminal 60B is 0 volt. Under this condition, the power source voltage VDD is applied to the antifuse 20B. The first, second and third antifuse-components A, B and C are connected in series between the power source electrode 8 and the output terminal 60B. The one thirds (⅓) of the power source voltage VDD are applied to the first, second and third antifuse-components A, B and C, respectively. Specifically, the one thirds of the power source voltage VDD are applied to each of the first, second and third sections of the antifuse dielectric layer portion 5.

From the description on the embodiment shown in FIG. 3, it will be appreciated that, in normal operation, applied voltage is divided and the divided portions of the applied voltage are applied to the plurality of antifuse-components A, B and C. The antifuse-components A, B and C are connected in series between the power source electrode 8 and the output terminal 60B that is grounded when the MOS transistor 10B is conductive. Eliminating the possibility that the antifuse dielectric layer portion 5 of the antifuse-components A, B and C may be punctured has enhanced reliability in normal operation of the semiconductor memory device.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. 2002-116313, filed Apr. 18, 2002, the disclosure of which is hereby incorporated by reference in its entirety.

What is claimed is:

1. A semiconductor memory device comprising:
   a memory cell including one portion of a dielectric layer; and
   a plurality of antifuse-components including another portion of the dielectric layer, the plurality of antifuse-components being connected in series one after another.

2. The semiconductor memory device as claimed in claim 1, further comprising a power source connected to the memory cell and the plurality of antifuse-components, one half of a voltage of the power source being applied across the one portion of the dielectric layer, a voltage resulting from dividing the voltage of the power source by a number of the plurality of antifuse-components being applied across the another portion of the dielectric layer.

3. The semiconductor memory device as claimed in claim 1, further comprising a semiconductor substrate including a MOS transistor,
   wherein the memory cell includes a capacitor, the capacitor including a capacitor first electrode that is a first portion of a first conductive layer formed on one side surface of the dielectric layer, and a capacitor second electrode that is a first portion of a second conductive layer formed over the semiconductor substrate, the capacitor first and second electrodes having interposed therebetween the one portion of the dielectric layer,
   wherein the plurality of antifuse-components include a first antifuse and a second antifuse,
   the first antifuse including an antifuse first electrode that is a second portion of the first conductive layer, and an antifuse second electrode that is a second portion of the second conductive layer,
   the second antifuse including the antifuse first electrode, and an antifuse third electrode that is a third portion of the second conductive layer,
   the antifuse first and second electrodes and the antifuse first and third electrodes having interposed therebetween one and another sections of the another portion of the dielectric layer, respectively,
   the antifuse second and third electrodes are electrically separated from each other,
   wherein one of the antifuse second and third electrodes is coupled to the MOS transistor and the other of the antifuse second and third electrodes is normally applied with a power source voltage, which is higher than an operation voltage that is used to charge the capacitor of the memory cell.

4. The semiconductor memory device as claimed in claim 3, wherein the operation voltage is lower than a breakdown voltage to puncture the dielectric layer, and the half of the power source voltage is lower than the breakdown voltage.

5. The semiconductor memory device as claimed in claim 4, wherein the first and second antifuse-components are shorted by applying to the other of the antifuse second and third electrodes a voltage higher than the power source voltage with the MOS transistor conductive.

6. The semiconductor memory device as claimed in claim 5, wherein the other section of another portion of the dielectric layer provides electrical insulation between the antifuse second and third electrodes.

7. The semiconductor memory device as claimed in claim 5, wherein the other of the antifuse second and third electrodes is connected to a conductor layer portion for external connection and the conductor layer portion is formed during processes of forming a gate of the MOS transistor.

8. The semiconductor memory device as claimed in claim 5, wherein the other of the antifuse second and third electrodes is connected to a diffused region for external connection and the diffused region is formed during processes of forming diffused regions for source and drain of the MOS transistor.

9. The memory device as claimed in claim 1, further comprising a semiconductor substrate including a MOS transistor,
   wherein the memory cell includes a capacitor, the capacitor including a capacitor first electrode that is a first portion of a first conductive layer formed on one side surface of the dielectric layer, and a capacitor second electrode that is a first portion of a second conductive layer formed over the semiconductor substrate, the capacitor first and second electrodes having interposed therebetween the one portion of the dielectric layer,
   wherein the plurality of antifuse-components include a first antifuse, a second antifuse and a third antifuse,
   the first antifuse including an antifuse first electrode that is a second portion of the first conductive layer, and an antifuse second electrode that is a second portion of the second conductive layer,
   the second antifuse including the antifuse first electrode, and an antifuse third electrode that is a third portion of the second conductive layer,
   the antifuse second and third electrodes are electrically separated from each other,
   the third antifuse including an antifuse fourth electrode that is a third portion of the first conductive layer, and an antifuse fifth electrode that is a fourth portion of the second conductive layer,
   the antifuse fourth electrode and the antifuse first electrode being electrically separated from each other,
   the antifuse fifth electrode and the antifuse third electrode being electrically connected to each other,
   the antifuse first and second electrodes, the antifuse first and third electrodes, and the antifuse fourth and fifth electrodes having interposed therebetween first, second and third sections of the another portion of the dielectric layer, respectively,
   wherein the antifuse second electrode is coupled to the MOS transistor and the antifuse fourth electrode is normally applied with a power source voltage, which is higher than an operation voltage that is used to charge the capacitor of the memory cell.

10. The semiconductor memory device as claimed in claim 9, wherein the antifuse third and fifth electrodes are connected to each other by a conductor layer portion and the conductor layer portion is formed during process of forming a gate of the MOS transistor.

11. The semiconductor memory device as claimed in claim 9, wherein the antifuse third and fifth electrodes are connected to each other by a diffused region and the diffused region is formed during processes of forming diffused regions for source and drain of the MOS transistor.

12. The semiconductor memory device as claimed in claim 9, wherein the antifuse fourth electrode is connected to a conductor for external connection.

13. A semiconductor memory device comprising:
    a memory cell comprising a first portion of a dielectric layer; and
    a plurality of antifuse-components comprising a second portion of the dielectric layer separated from the first portion, the plurality of antifuse-components being connected in series one after another.

14. A semiconductor device comprising a memory cell with a cell capacitor, and first and second antifuse-components connected in series, each of said first and second antifuse-components being of a capacitor type in which a dielectric layer is sandwiched between lower and upper conductive layers.

15. The semiconductor device as claimed in claim 14, further comprising an insulating layer, a first part of said insulating layer being used as a dielectric layer of said cell capacitor, a second part of said insulating layer being used as the dielectric layer of said first antifuse-component, and a third part of said insulating layer being used as the dielectric layer of said second antifuse-component.

16. The semiconductor device as claimed in claim 15, further comprising a transistor and a power supply line, said first and second antifuse-components being connected in series between said power supply line and said transistor.

* * * * *